United States Patent [19]

Lofdahl

[11] 4,074,420
[45] Feb. 21, 1978

[54] METHOD AND APPARATUS FOR THE ASSEMBLY OF JACKETED ELECTRONIC DEVICES

[75] Inventor: Clyde A. Lofdahl, Los Altos, Calif.
[73] Assignee: Raychem Corporation, Menlo Park, Calif.
[21] Appl. No.: 712,037
[22] Filed: Aug. 5, 1976
[51] Int. Cl.² ............................................. H01R 43/02
[52] U.S. Cl. ......................................... 29/628; 29/590;
29/748; 29/759; 29/760; 228/123; 228/135; 228/6 A
[58] Field of Search .................... 29/628, 569 R, 589, 29/590, 557, 203 J, 203 P, 748, 759, 760; 228/123, 135, 136, 176, 180 R, 212, 44.1 A, 6 A; 219/243 R; 174/94, DIG. 8; 269/321 NE

[56] References Cited

U.S. PATENT DOCUMENTS

| | | | |
|---|---|---|---|
| 3,178,796 | 4/1965 | Smits | 29/569 |
| 3,299,502 | 1/1967 | Wanesky | 29/569 |
| 3,414,962 | 12/1968 | Altamura | 29/203 J X |
| 3,446,912 | 5/1969 | Diehl et al. | 174/94 R |
| 3,800,408 | 4/1974 | Schimmer et al. | 228/56 X |

Primary Examiner—James R. Duzan
Attorney, Agent, or Firm—Lyon & Lyon

[57] ABSTRACT

An apparatus and method employing a plurality of heating boats to provide for the soldered assembly of leads, electronic components and plastic jackets without intermediate handling steps. Two heating boats are positioned on either side of a jacket retaining block such that the heating cavities of the first boat are aligned in an opposed relationship with the heating cavities of the second boat. Passageways through the plate extend between the opposed heating cavities. The heating cavities of the first boat receive leads, electronic components and solder wafers which are heated to form assembled electronic devices. The assembled devices are then moved through the passageways in the plate into the second boat where jackets, previously positioned in the heating cavities of the second boat, are heated to recover about the leads and components. The leads are maintained in alignment in passageways extending from the closed ends of the heating cavities to prevent premature bending loads on the assembled components.

18 Claims, 3 Drawing Figures

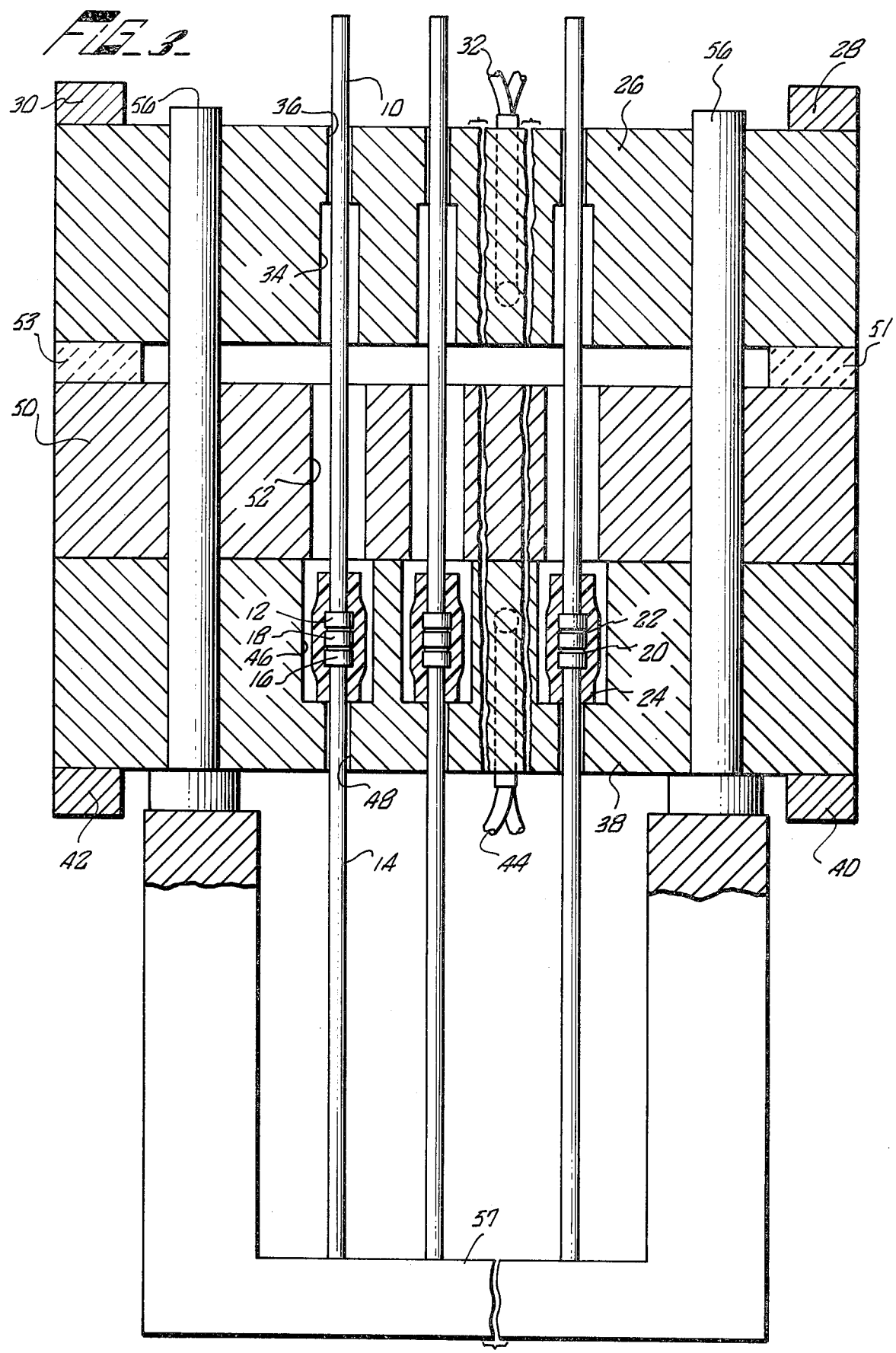

METHOD AND APPARATUS FOR THE ASSEMBLY OF JACKETED ELECTRONIC DEVICES

BACKGROUND OF THE INVENTION

The present invention is directed to a method and apparatus for assembling leads, electronic components and jackets to form jacketed electronic devices. More specifically, the present invention provides a method and apparatus for assembling jacketed electronic devices without requiring the devices to be taken from the heating system until finally assembled.

With the advent of miniaturization, electronic devices have been developed employing very small semiconductor dies which are in the form of small blocks. It is often required that these blocks or electronic components be associated with two leads extending from opposite sides of each component in order that the component may be integrated into an electronic system. Consequently, conductor leads have been developed which include a swaged end for mating with one side of such an electronic component. A thin wafer of solder may be employed to bond each conductor lead to the electronic component.

To assemble such electronic devices from leads and electronic components, a device, commonly referred to as a boat, has been developed. Such a boat generally includes a large number of heating cavities which each receive, in order, a first lead, a solder wafer, an electronic component, a second solder wafer and a second lead. The boat is of carbon which may be associated with an electrical supply to cause the boat to heat up. Heating of the boat allows the solder to melt and bond the leads on either side of each electronic component. Each assembled device is often fitted with a heat recoverable jacket or other covering following removal of the assembled device from the boat to provide protection, electrical isolation and structural strength.

Many difficulties have been experienced in the fabrication of such jacketed electronic devices. First, the handling of each electronic component with its leads is tedious, time consuming and expensive. Furthermore, it is necessary to allow for substantial cooling of the surrounding boat prior to removal of the assembled electronic device because solders generally experience low strength at elevated temperatures. This low strength increases the possibility that the bond between a lead and the electronic component may be disrupted during handling of the component or during the covering operation which follows the soldering step.

SUMMARY OF THE INVENTION

The present invention is directed to an apparatus and method which eliminates handling of the assembled leads and electronic components before jackets are positioned thereon. To accomplish this automatic operation, two boats are provided into which the leads, the electronic components and the covering jackets are placed. The boats are arranged such that the heating cavities of one boat face and are aligned with the heating cavities of the other boat. A plate for retaining the jackets in one of the boats is positioned between the boats and aligned such that holes extending through the plate extend between aligned heating cavities in the boats. The leads, electronic components and solder wafers are first heated in one boat and then moved through the passageways in the plate into the second boat where the jackets are caused to be assembled with the components. Alignment of the leads is always maintained during this passage of the component from boat to boat.

By aligning boats and passing components therebetween, the tedious steps of allowing the components to cool and then individually placing jackets thereon is avoided. Because alignment of the leads is maintained during assembly, the chance that the solder bonds will be disturbed is greatly reduced. Furthermore, a very consistent product may be obtained by this automated process. The jackets are preferably heat-shrinkable tubes and may include a fusible lining. The second boat may then by heated to initiate recovery of the heat-shrinkable tubes and melt the linings about the assembled electronic devices. The recovered tube forms a supporting and insulating jacket while the fusible material forms a seal about the electronic component. One such jacket is disclosed in U.S. Pat. No. 3,243,211, to Wetmore.

Accordingly, it is an object of the present invention to provide an improved method for assembling electronic devices.

It is another object of the present invention to provide an apparatus for assembling electronic devices.

It is yet another object of the present invention to provide an improved method and apparatus for attaching leads to an electronic component and positioning a jacket thereabout while maintaining the leads in supported, mutual alignment.

Other and further objects and advantages will appear hereinafter.

BRIEF DESCRIPTION OF THE DRAWINGS

FIG. 3 is a cross-sectional elevation of the apparatus of the present invention with the jacketed electronic devices fully assembled.

DETAIL DESCRIPTION OF THE DRAWINGS

Figure 1:
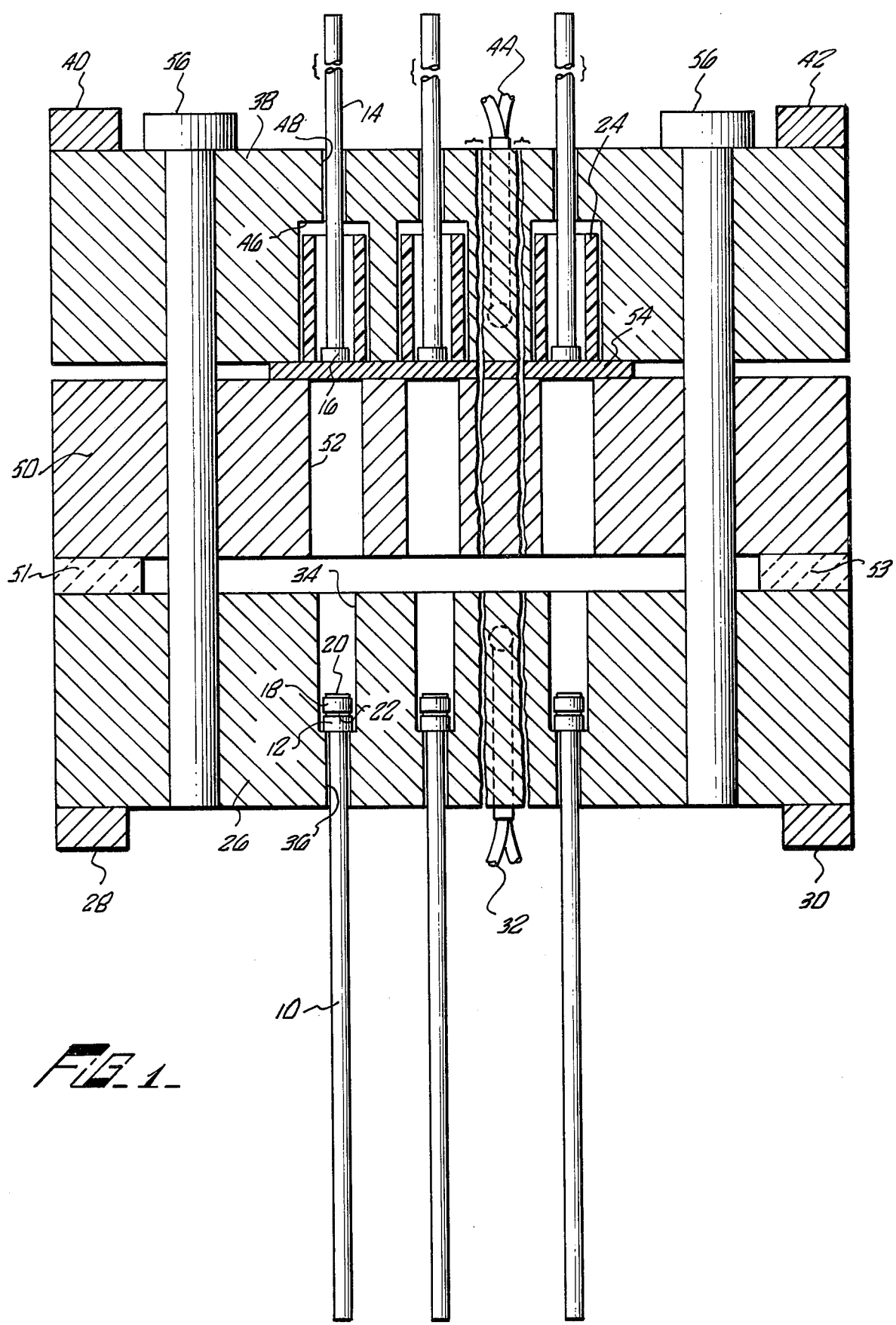
FIG. 1 is a cross-sectional elevation of the apparatus of the present invention with the boats loaded and aligned.

The present invention is illustrated in three successive steps to the completion of the enclosed electronic devices. Only three such devices are illustrated. However, it is to be understood that as many as 500 to 1,000 such devices may be made in a single operation. Each electronic device, illustrated in its assembled form in FIG. 3, includes a first conductive lead 10 having a swaged head 12. A second conductive lead 14 is also provided with a swaged head 16. An electronic component 18 is positioned between the swaged heads 12 and 16 and may be bonded thereto by solder wafers 20 and 22. The electronic component 18 is most commonly a semiconductor die. The leads 10 and 14 and the solder wafers 20 and 22 are of conventional design.

The resulting electronic device formed by the leads 10 and 14 and the electronic component 18 is generally not suitably protected from both the environment and external stress. Consequently, a jacket 24 is tightly positioned about each assembly of leads and electronic components. Each jacket 24 may be of a material capable of exhibiting the properties of heat recoverability. In such an instance, the jacket 24 is provided in its heat recoverable form in order that, upon heating, the jacket may shrink about the electronic component 18 and about the swaged heads 16 and 12 of the leads 10 and 14. Conveniently, a fusible layer is provided on the inner surface of the jacket 24. This fusible material is also heat responsive in that it will melt at an appropriate temperature to insure a proper seal in the jacket 24. The recovered jacket 24 thus provides a seal against environmental intrusion. Furthermore, its inflexible nature when cooled and its tight adherence to the enclosed electronic component and leads give structural rigidity to the resulting electronic device thus formed. One such jacket is disclosed in U.S. Pat. No. 3,243,211, to Wetmore.

In forming such electronic devices as just described, the solder wafers 20 and 22 must be heated sufficiently to allow the solder to melt. Once melted, the solder may resolidify to bond each lead 10 and 14 to the electronic component 18. To accomplish this, it has been known to heat the entire assembled components. The temperature of the assembly may be brought to a level of 375° C and then allowed to cool. As the leads and electronic components cool, the solder forms a bond therebetween. However, the temperature of the solder must be lowered substantially below its melting point before the solidifying solder regains strength. Thus, until the assembly has been allowed to cool substantially, it will not maintain structural integrity if subjected to normal handling. As a result, such assemblies fabricated in the past have required substantial cooling time to avoid the chance of destruction with further handling.

In the present invention, such further handling is circumvented by carefully controlling the orientation of the leads 10 and 14 as the electronic component 18 is passed into the jacket 24. This careful control of the leads 10 and 14 is further maintained while the jacket 24 is recovered about the assembly. Once the jacket has recovered about the assembly, structural integrity is provided by the jacket itself. The component may then be removed for storage or use.

The apparatus employed to carry out the assembly of the electronic component 18 with the leads 10 and 14 and the positioning of the jacket 24 about this assembly includes a conventional heating block or boat 26. The boat 26 is of carbon and has bus bars 28 and 30 at opposite ends of one side thereof. The bus bars 28 and 30 may be hooked to an electrical energy source. The carbon boat 26 then acts as a mass resistance heater and is heated very uniformly throughout. A thermocouple 32 is provided midway between the bus bars 28 and 30 where it simply extends into one side of the boat 26. As the thermocouple 32 is away from the bus bars 28 and 30, it may be calibrated to indicate when the boat 26 has reached an appropriate temperature.

The boat 26 includes heating cavities 34 which are open at one end and extend perpendicularly into the body of the boat 26. These heating cavities 34 are most conveniently cylindrical and are of sufficient depth to receive the swaged head 12 of the first conductor lead 10, the electronic component 18, the swaged head 16 of the second conductive lead 14 and two solder wafers 20 and 22 well below the surface of the boat 26.

Extending from the second, closed end of each heating cavity 34 is a passageway 36 which is axially aligned with the corresponding heating cavity 34. The passageways 36 are of a diameter capable of slidably receiving the conductive leads 10 and provide alignment therefor. The passageways 36 are also narrow enough to prevent passage of the swaged head 12 therethrough. Thus, the first conductive lead 10 may be positioned down into the boat 26 by passing the lead 10 through the heating cavity 34 and the passageway 36 until the swaged head 12 of the lead 10 comes to rest at the second, closed end of the heating cavity 34. A solder wafer 22, the electronic component 18 and a second solder wafer 20 may then be dropped into the heating cavity 34 in that order.

A second heating block, or boat 38 is also employed in the present invention. The second heating boat 38 is constructured similarly to the boat 26 and is also of carbon with bus bars 40 and 42. Furthermore, a thermocouple 44 is similarly positioned. Heating cavities 46 are provided in an identical pattern to that of the heating cavities 34 in order that the heating cavities of the two boats 26 and 38 may be aligned. The heating cavities 46 of the second boat 38 are larger in diameter than the heating cavities 34 of the boat 26. This larger diameter is for the accommodation of the heat recoverable jackets 24 which are positioned therein as can be seen in FIG. 1. The heating cavities 46 are of sufficient depth to accomodate the full length of each jacket 24. A passageway 48 extends from the second, closed end of each of the heating cavities 46 for accommodation of the stem of the second conductive lead 14. Again, the passageway 48 is small enough to prevent passage of the swaged head 16 of the second conductive lead 14 therethrough. Thus, prior to assembly of the boat 38 with the remaining components of the present invention, the jackets 24 and the second conductive leads 14 are positioned in the heating cavities 46 with the second conductive leads 14 aligned by the passageways 48.

A plate 50 is positioned between the boats 26 and 38. Holes 52 extend through the plate in a pattern identical to that of the heating cavities 34. The plate 50 is aligned with the boat 26 such that the holes 52 are in alignment with the heating cavities 34. The holes 52 have a diameter at least equal to that of the heating cavities 34 in order that the swaged heads 12 and 16 of the leads 10 and 14 may pass easily from the heating cavities 34 as will be more fully set out below. Spacers 51 and 53 are positioned between the plate 50 and the boat 26 to provide a space between the boat 26 and the plate 50. The space insures that the heat of the boat 26 will not be transmitted to the sleeves 24 positioned in the boat 38. The spacers 51 and 53 may be of any form which will provide the appropriate spacing and not interfere with the operation of the assembly or be of sufficient size and conductivity to allow substantial heat transfer between the boat 26 and the plate 50 if the plate 50 is itself heat conductive. One or the other of the spacers 51 and 53 and the plate 50 should also be electrically insulative to prevent electrical current used to heat one of the boats to pass to the other boat.

Above the block 50, the second boat 38 is aligned such that the heating cavities 46 are in communication with the holes 52 in the block 50. The heating cavities 34 and 46 and the holes 52 are thus aligned. The holes 52 are also smaller in diameter than the heating cavities 46 in order that a shoulder may be provided to retain the jackets 24 in place in the heating cavities 46. To achieve a proper placement of the second boat 38 in an inverted position on the plate 50 as seen in FIG. 1, a thin plate 54 may be employed to cover the open ends of the heating cavities 46. Once the second boat 38 has been positioned and aligned, the plate 54 may be removed. Removal of the plate 54 allows the leads 14 to fall through the holes 52 in the plate 50 and into the heating cavities 34. Inspection of the ends of the second conductive leads 14 will determine whether or not all of the leads 14 have become properly positioned in the heating cavities 34. Removal of the plate 54 does not allow the jackets 24 to fall from the heating cavities 46 because of the smaller diameter of the holes 52 which provide a restraining shoulder for the jackets 24. This condition thus achieved is illustrated in FIG. 2.

To insure alignment of the two boats 26 and 28 and the plate 50, guide means are provided. In the present embodiment, these guide means are provided by nonconductive pins 56 which extend through accurately formed holes. A plurality of other guide means may be employed without departing from the inventive concept herein.

Figure 2:
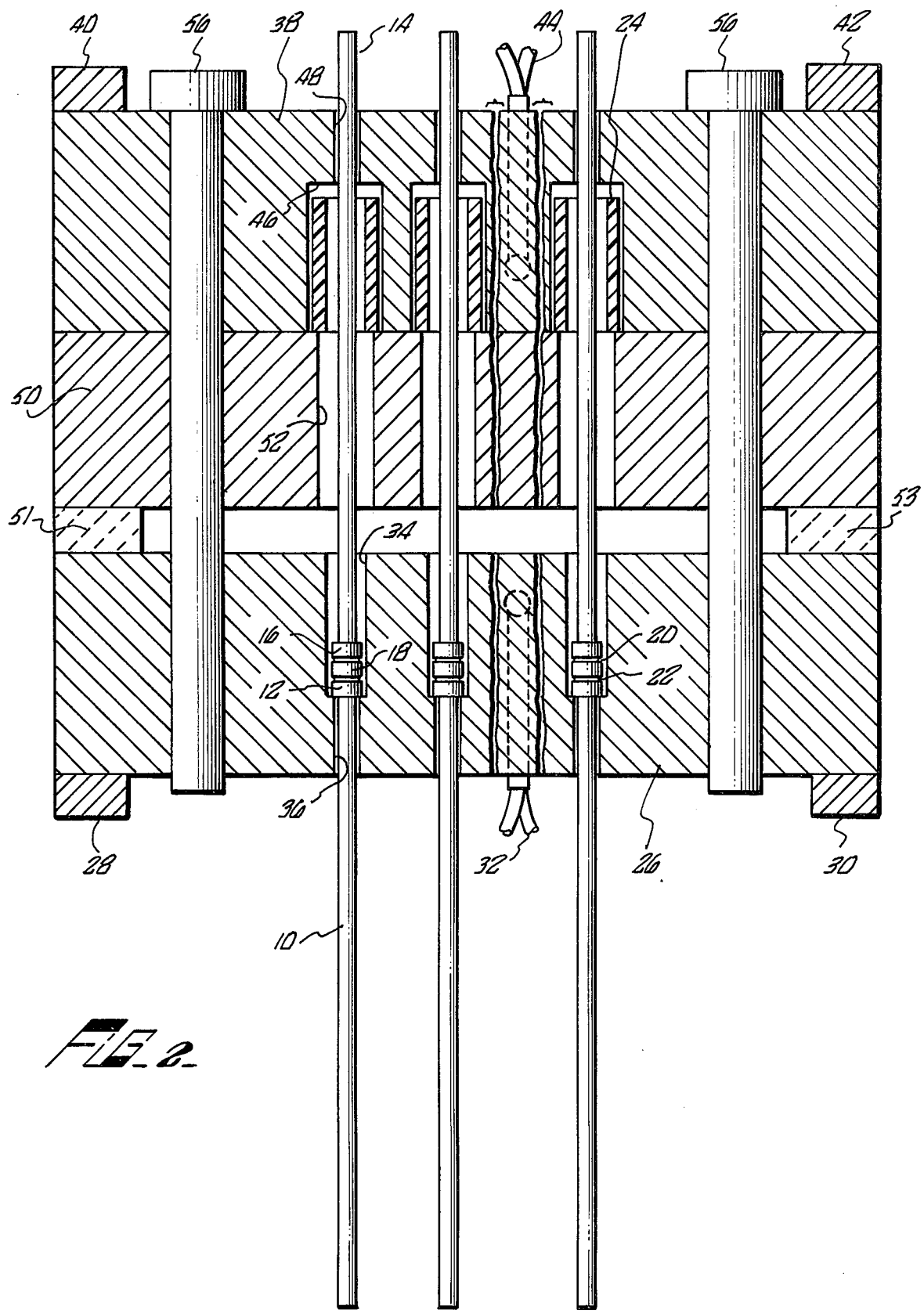
FIG. 2 is a cross-sectional elevation of the apparatus of the present invention with the leads and electronic components assembled.

Once two leads 10 and 14, an electronic component 18 and solder wafers 20 and 22 have been positioned in each heating cavity 34, as can be seen in FIG. 2, electrical energy is provided to the bus bars 28 and 30 of the lower boat 26. The temperature of the boat 26 and correspondingly the components contained within the heating cavities 34 is brought up to a temperature sufficient to melt the solder wafers 20 and 22 for bonding with the components. Once this temperature is reached as determined by the thermocouple 32, the power is removed. The assembly of leads 10 and 14 and the electrical component 18 is then allowed to cool sufficiently to provide some bonding strength to the solder wafers 20 and 22.

Once sufficient bonding strength is returned to the solder, the entire assembly of the two boats 26 and 38 and the plate 50 may be inverted. Inversion of this assembly allows the assembled leads 10 and 14 and electronic components 18 to fall from the heating cavity 34 through the hole 52 and into the heating cavity 46. A positioning plate 57 may prevent the swaged head 16 of each lead 14 from reaching the second, closed end of each heating cavity 46. Thus, each electronic component 18 is positioned in the middle of a heat recoverable jacket 24.

Power may then be supplied to the boat 38 such that the boat 38 is heated to a temperature which will bring about recovery of the heat recoverable jacket 24. Before heating the sleeves, the boat 26 and the plate 50 may be removed for reloading. When the appropriate temperature is reached by the boat 38, the jackets 24 will shrink to closely conform to the electronic components 18 and the swaged heads 12 and 16. The lining of fusible material provided within each jacket 24 will also melt as the temperature of the boat 38 is raised to provide a proper seal between the jacket 24 and the leads 10 and 14. This last condition is illustrated in FIG. 3. Once the jackets 24 have been properly placed on each electronic component 18, the boats may be disassembled to free the resulting electronic device for further cooling and handling, if any is required. The two boats 26 and 28 are separately heated to perform different functions. The first boat 26 is heated to around 375° C to properly melt the solder. The second boat 38 is only heated to 250° C to bring about recovery of the jackets 24 and fuse the liner. The lower temperature of the jacket placement step does not remelt the solder.

An example of one embodiment of the present invention which is not to be construed as limiting the invention to one specific size or set of proportional relationships is here set forth. Each boat 26 and 38 is 0.95 cm. (0.375 inch) high, 10.16 cm. (4 inches) deep and 15.24 cm. (6 inches) long. The boats are of carbon and are subjected to a 6 volts, 30–60 amp. current for from 2–3 minutes to achieve the required temperature. The heating cavities 34 and 46 are in a pattern having a center-to-center distance of 0.38 cm. (0.15 inch).

The plate 50 is of any convenient material such as aluminum and has external dimensions equal to that of the two boats 26 and 38. The thickness of the plate 50 need only be sufficient to rigidly hold itself spaced from the boat 26 on the spacers 51 and 53. The centerline-to-centerline distances between the holes 52 is also 0.38 cm. (0.15 inch). The diameter of the heating cavities 34 is 0.152 cm. (0.060 inch). The diameter of the heating cavities 46 is 0.318 cm. (0.125 inch). The holes 52 of the plate 50 have a diameter of 0.229 cm. (0.090 inch). The space between the plate 50 and the boat 26 is 0.635 cm. (0.25 inch).

The above components are sized to accomodate a semiconductor die 0.114 cm.$^2$ (0.045 inch$^2$) and 0.064 cm. (0.025 inch) high. The leads have a nominal diameter of 0.076 cm. (0.030 inch) with a length of 3.81 cm. (1.5 inch). The swaged end of each lead 10 and 14 is 0.127 cm. (0.050 inch) in diameter. The heat recoverable jacket 24 is 0.305 cm. (0.120 inch) in diameter with a wall thickness of 0.051 cm. (0.020 inch). When fully recovered, the jacket 24 has an outside diameter of 0.254 cm. (0.100 inch) with a wall thickness of 0.064 cm. (0.025 inch). The jacket 24 may be of polytetramethyleneterephthalate and the adhesive is a common hot melt adhesive.

Thus, both a method and apparatus are provided for advantageous and facile assembly of electronic devices which cut down substantially on the amount of labor and steps required for such assembly while at the same time improving the probability of the successful assembly of such devices.

While embodiments and applications of this invention have been shown and described, it would be apparent to those skilled in the art that many more modifications are possible without departing from the inventive concepts herein described. The invention, therefore, is not to be restricted except by the spirit of the appended claims.

What is claimed is:

1. A method for assembling electronic devices, including the steps of
    loading the heating chambers of a first heating block with leads and electronic components;
    loading the heating chambers of a second heating block with jackets for electronic components;
    positioning the second heating block above the first heating block and aligning the heating chambers of each heating block;
    heating the first heating block with the leads and electronic components positioned therein to fix the leads to the electronic components;
    moving the fixed leads and electronic components into the heating chambers of the second heating block following alignment of the heating chambers of the heating blocks; and
    heating the second block with the fixed leads and electronic components therein to fix the jackets about the fixed leads and electronic components.

2. The method of claim 1 wherein the step of moving the fixed leads and electronic components into the heating chambers of said second heating block includes inverting the first and second heating blocks to allow the fixed leads and electronic components to fall into the heating chambers of the second heating block.

3. The method of claim 1 further comprising steps of positioning a plate between the first and second heating blocks, said step of positioning and aligning the second heating block being performed prior to said step of heating the first heating block.

4. The method of claim 1 wherein solder wafers are located with the leads and electronic components and said step of heating the first heating block melts the solder wafers.

5. The method of claim 1 wherein the jackets include a lining of fusible material and said step of heating the second heating block melts the fusible material.

6. The method of claim 1 wherein the jackets are heat recoverable to shrink about the fixed leads and electronic components positioned therein when heated to a recovery temperature, said step of heating the second heating block is to a temperature allowing recovery of the jackets.

7. The method of claim 4 wherein the step of heating the second heating block is to a temperature below the melting point of the solder wafers.

8. The method of claim 1 further including the step of loading leads into the heating chambers of the second heating block, said leads being allowed to move into the heating chambers of the first heating block following the positioning of the second heating block above the first heating block.

9. The method of claim 8 further including the step of positioning a solid sheet across the openings of the heating chambers of the second heating block to prevent the leads positioned in the heating chambers of the second heating block from moving therefrom until the second heating block is positioned and aligned with the first heating block.

10. A method for assembling electronic devices including the steps of
    loading the heating chambers of a first heating block with leads, electronic components and solder wafers;
    loading the heating chambers of a second heating block with jackets for electronic components and leads;
    positioning the second heating block above the first heating block and aligning the heating chambers of each heating block;
    heating the first heating block with leads and electronic components positioned therein to fix the leads to the electronic components by melting the solder wafers;
    moving the fixed leads and electronic components into the heating chambers of the second heating block; and
    heating the second heating block with the fixed leads and electronic components therein to fix the jackets about the fixed leads and electronic components.

11. A method of claim 10 wherein the jackets include a lining of fusible material and are heat recoverable to shrink about the fixed leads and electronic components positioned therein when heated to a recovery temperature, said step of heating the second heating block being to a temperature melting the fusible material and allowing recovery of the jackets.

12. A method for assembling electronic devices, including the steps of
    loading the heating chambers of a first heating block and leads, electronic components and solder wafers;
    loading heating chambers of a second heating block with leads and heat shrinkable jackets having a lining of fusible material;
    positioning a plate having holes therethrough on the first heating block such that the holes extending through the plate are aligned with the openings of the heating chambers of the first heating block;
    positioning the second heating block above the first heating block on the plate such that the heating chambers of the second heating block are aligned with the holes extending through the plate;
    allowing the leads positioned in the second heating block to move into the heating chambers of the first heating block;
    heating the first heating block with the leads and electronic components positioned therein to fix the leads to the electronic components by melting the solder wafers;
    moving the fixed leads and electronic components into the heating chambers of the second heating block; and
    heating the second heating block with the fixed leads and electronic components therein to melt the adhesive and promote heat recovery of the jackets about the fixed leads and electronic components.

13. An apparatus for the assembly of leads, electronic components and encapsulating jackets into electronic devices, comprising
    a first heating block having heating cavities therein, each heating cavity of said first heating block having a first open end and a cross-sectional area in which the leads and the electronic components closely fit;
    a plate having holes therethrough, said holes being spaced to allow alignment with said heating cavity of said first heating block, said holes each having a cross-section allowing free passage of the leads and the electronic components therethrough; and
    a second heating block having heating cavities therein, said heating cavities of said second heating block being positioned to allow alignment with said heating cavities of said first heating block, having a first open end and having a cross-sectional area capable of receiving the jackets for the leads and electronic components, said holes of said plate each being sized to prevent passage of the jackets therethrough.

14. The apparatus of claim 13 wherein said heating cavities of said first heating block each have a second, closed end through which extends a narrow passageway axially aligned therewith, said first passageway allowing placement of lead wires of the leads therethrough.

15. The apparatus of claim 13 further including guide means extending through said first heating block, said plate and said second heating block to align said heating cavities and said holes.

16. The apparatus of claim 13 wherein the assembly of said first heating block, said plate and said second heating block may be inverted.

17. The apparatus of claim 14 wherein said heating cavities of said second heating block each include a second, closed end having a second passageway extending therefrom in axial alignment with the heating cavity of said second heating block, said first passageways and said second passageways being aligned when said first heating block and said second heating block are brought into alignment, said first and second passageways holding said leads when positioned therein to prevent relative lateral or bending motion therebetween during assembly.

18. The apparatus of claim 13 further including a plate positionable over the openings of the heating cavities of said second heating block to prevent escape of the contents thereof.

* * * * *